United States Patent [19]

Chun et al.

[11] Patent Number: 5,759,748

[45] Date of Patent: Jun. 2, 1998

[54] METHOD FOR FORMING PHOTORESIST PATTERN

[75] Inventors: Jun Sung Chun; Yong Suk Lee; Ki Ho Baik, all of Kyoungki-do, Rep. of Korea

[73] Assignee: Hyundai Electronics Industries Co., Ltd., Ichon-Kun, Rep. of Korea

[21] Appl. No.: 816,479

[22] Filed: Mar. 13, 1997

Related U.S. Application Data

[63] Continuation of Ser. No. 541,968, Oct. 10, 1995, abandoned.

[30] Foreign Application Priority Data

Oct. 12, 1994 [KR] Rep. of Korea .................. 94-26082

[51] Int. Cl.[6] ......................................................... G03F 7/36
[52] U.S. Cl. ........................... 430/323; 430/325; 430/296
[58] Field of Search ................................ 430/323, 325, 430/326, 296

[56] References Cited

U.S. PATENT DOCUMENTS

| | | | |
|---|---|---|---|
| 4,560,641 | 12/1985 | Kokaku et al. | 430/312 |
| 4,657,843 | 4/1987 | Fukuyama et al. | 430/323 |
| 4,908,299 | 3/1990 | Ogawa | 430/323 |
| 5,093,224 | 3/1992 | Hashimoto et al. | 430/296 |
| 5,350,485 | 9/1994 | Shiraishi et al. | 156/628 |
| 5,439,781 | 8/1995 | MacDowell et al. | 430/311 |

FOREIGN PATENT DOCUMENTS 3537626  4/1986  Germany .

*Primary Examiner*—John A. McPherson
*Attorney, Agent, or Firm*—Reid & Priest LLP

[57] ABSTRACT

A method for forming photoresist patterns, comprising the steps of: coating a chemically enhanced photoresist film on a lower layer; forming a silicon monomer layer on the chemically enhanced photoresist film; exposing the monomer layer through a mask, to selectively polymerize the silicon monomer; removing the unexposed regions of the monomer layer by development; and subjecting the remaining polymerized regions to oxygen plasma developing process to form oxide films through reaction of oxygen with the silicon contained in the polymerized regions and to form photoresist patterns through selective etching of the photoresist film, with the oxide films serving as a mask. Exposure of the silicon monomer generates protons from the chemically enhanced photoresist film which trigger the polymerization of the silicon monomer. The polymer thus formed is not removed by typical developing solutions and serves as a mask when etching the photoresist film with oxygen plasma because a thin silicon oxide ($SiO_2$) is formed on the silicon contained polymer.

9 Claims, 3 Drawing Sheets

(a)

(b)

(a)

(b)

METHOD FOR FORMING PHOTORESIST PATTERN

This is a continuation of U.S. application Ser. No. 08/541,968 filed Oct. 10, 1995, now abandoned.

BACKGROUND OF THE INVENTION

1. Field of the Invention

The present invention relates, in general, to a method for forming photoresist patterns and, more particularly, to a simple diffusion enhanced silylated resist (hereinafter referred to as "DESIRE") method in which silicon injection processing is unnecessary.

2. Description of the Prior Art

In order to better understand the background of the invention, a description of a conventional method utilizing DESIRE processing will be given below, in connection with FIG. 1.

FIG. 1A is a cross sectional view after a chemically enhanced photoresist 3 coated on a lower layer 1 was exposed to light through a mask 4, to form exposed regions 5.

FIG. 1B is a cross sectional view after silicon was injected into the exposed regions 5 by a silylation process, to form silylated resist regions 6.

FIG. 1C is a cross sectional view after an oxygen plasma development process was carried out to form silicon oxide films 7 through the reaction of oxygen with the silicon of the silylated resist regions 6 and to form photoresist patterns 3' through etch of the unexposed regions of the photoresist 3, simultaneously.

A significant problem of this conventional DESIRE method is that critical dimension is changed, which is attributed to the fact that hydrolysis arises owing to the delay time between processes, causing the our-diffusion of silicon. And, this conventional method is problematic in pattern substantiality. That is, swelling occurs when using tetramethyl disilazane (TMDS), a compound comprising dimethyl silicon or hexamethyl disilazane (HMDS), a compound comprising trimethyl silicon because of bulkiness of the compounds. As a result, pattern deformation occurs.

SUMMARY OF THE INVENTION

Accordingly, it is a principal object of the present invention to overcome the above problems encountered in the prior art and to provide a simple method for forming photoresist patterns, which is capable of showing the effect of silicon injection without requiring a silicon injection process.

Based on intensive and thorough research by the present inventors, the above object is accomplished by providing a method for forming photoresist patterns, comprising the steps of: coating a chemically enhanced photoresist film on a lower layer; forming a silicon monomer layer on the chemically enhanced photoresist film; exposing the monomer layer to light through a mask, to selectively polymerize the silicon monomer; removing the unexposed regions of the monomer layer by development; and subjecting the remaining polymerized regions to oxygen plasma developing process to form oxide films through reaction of oxygen with the silicon contained in the polymerized regions and to form photoresist patterns through selective etching of the photoresist film, with said oxide films serving as a mask.

According to the present invention, exposure of silicon monomers generates protons from the chemical enhanced photoresist film which trigger the polymerization of silicon monomers. The polymer thus formed is not removed by typical developing solutions and serves as a mask when etching the photoresist film with oxygen plasma because a thin silicon oxide ($SiO_2$) is formed on the polymer, which contains silicon.

BRIEF DESCRIPTION OF THE DRAWINGS

The above object and other advantages of the present invention will become more apparent by describing in detail the preferred embodiments of the present invention with reference to the attached drawings in which.

DETAILED DESCRIPTION OF THE INVENTION

Figure 1A:
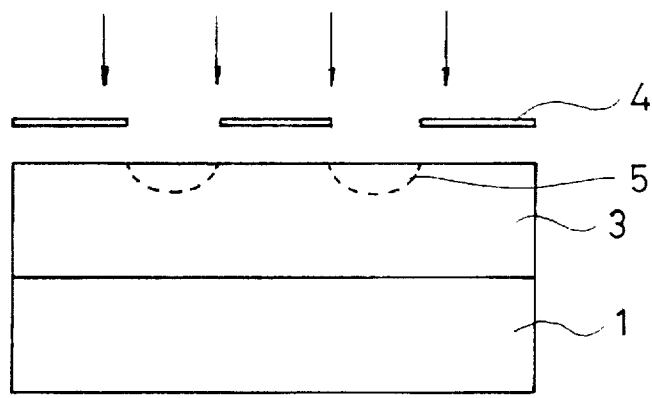
FIGS. 1A to 1C are schematic cross sectional views showing a conventional DESIRE method for forming photoresist film patterns.
Figure 1B:
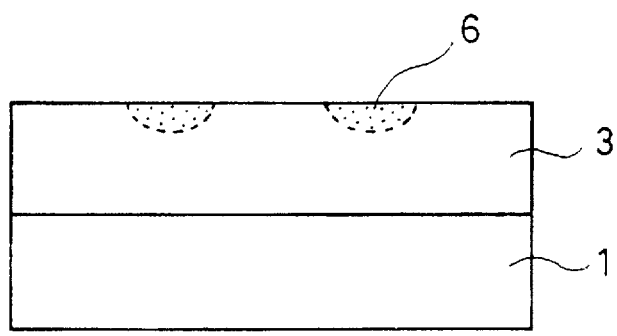
Figure 1C:
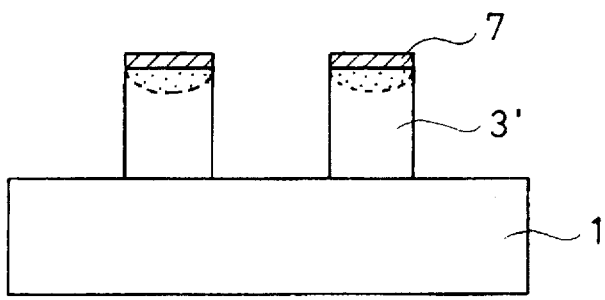

The application of the preferred embodiments of the present invention is best understood with reference to the accompanying drawings, wherein like reference numerals are used for like and corresponding parts, respectively.

Referring to FIG. 2, there is illustrated a method for forming photoresist patterns according to the present invention.

Figure 2A:
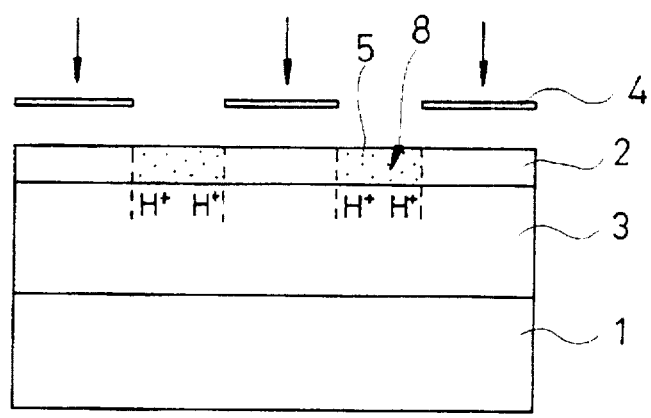
FIGS. 2A to 2C are schematic cross sectional views showing a DESIRE method for forming photoresist film patterns, according to the present invention.

First, FIG. 2A is a schematic cross section after a silicon monomer layer 2 is formed on a chemically enhanced photoresist film 3 coated on a lower layer 1, followed by exposure of the monomer layer to light through a mask 4, to change the exposed regions of the monomer layer 2 into polymeric films 7 containing silicon. This polymer results from the polymerization of the silicon monomers themselves, which is triggered by acid ($H^+$). $H^+$ is generated by a photo acid generator contained in the photoresist film 3 upon exposure. In one preferred embodiment the monomer is $CR_2CRSi(OR)_3$ in which R is an alkyl or aryl. In another preferred embodiment the monomer is $R_2Si(OR)_2$ where R is an alkyl or aryl.

Figure 2B:
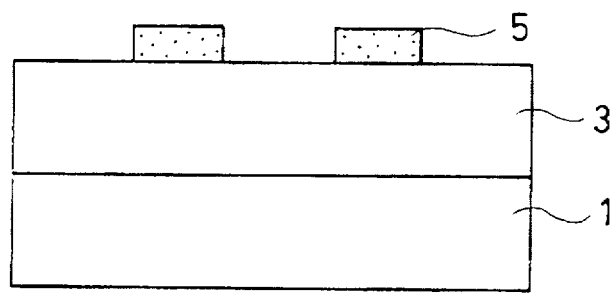

FIG. 2B is a cross section after a developing process using a typical solution is carried out to remove the unexposed monomer regions 2 while leaving the polymeric regions 5.

Figure 2C:
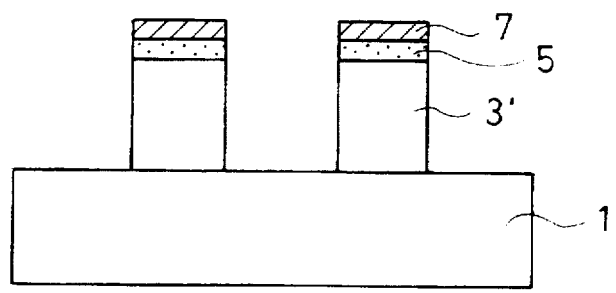

FIG. 2C is a cross section after the resulting structure of FIG. 2B is subjected to oxygen plasma development, to form silicon oxide layers 7 through the reaction of oxygen with silicon contained in the polymer 5 and to form photoresist patterns 3' through the selective etch of the photoresist film 3 with the silicon oxide layers 7 serving as a mask.

Deep ultra violet, electron beams or X-rays can be used for exposing the monomers layer 2. Although only negative type chemically enhanced photoresist film is stated, the present invention can be applied to a positive type chemically enhanced photoresist film.

Figure 3:
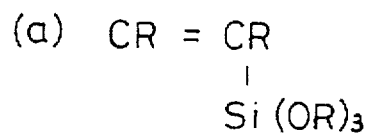
FIGS. 3A and 3B show structural formulas of silicon monomers useful in the present invention.
Figure 3:
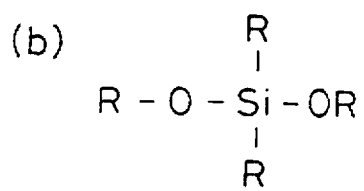

Referring to FIG. 3, molecular structures of the silicon monomers used for the invention are shown. In the molecular structures, R represents an alkyl or aryl.

Figure 4:
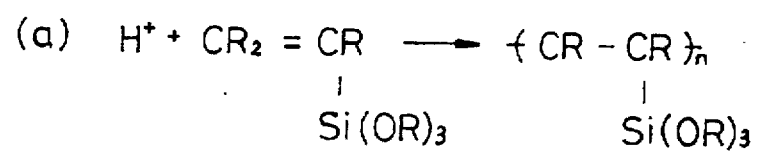
FIGS. 4A and 4B show structural formulas of the polymers which are formed from the silicon monomers of FIG. 3A and 3B, respectively.
Figure 4:
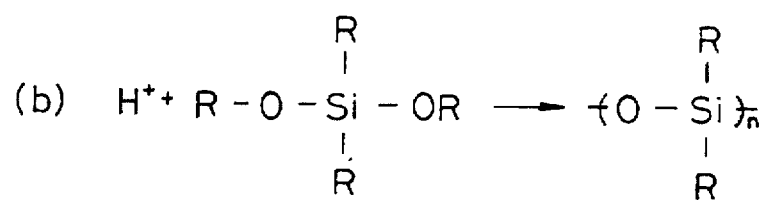

Referring to FIG. 4, there are formulas showing the polymerization of the silicon monomers of FIG. 3.

The aforementioned problems of the conventional DESIRE method, that is, the unstable critical dimension which is caused by the out-diffusion of silicon attributable to hydrolysis because of the time delay between processes that allows water to be formed, and corresponding poor pattern substantiality, are solved by the present invention. In addition, the method according to the present invention exhibits the effect of silicon injection without requiring a silicon injection process.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A method for forming a photoresist pattern, comprising the steps of:

coating a chemically enhanced photoresist film on a lower layer;

forming a silicon monomer layer comprising $CR_2CRSi(OR)_3$ wherein R is alkyl or aryl on the chemically enhanced photoresist film;

exposing the silicon monomer layer through a mask, to selectively polymerize the silicon monomer layer and form polymerized regions containing silicon;

removing the unexposed, unpolymerized regions of the silicon monomer layer by development;

subjecting the remaining polymerized regions to an oxygen plasma developing process to form a silicon oxide film on the polymerized regions through reaction of oxygen with the silicon contained in the polymerized regions; and selectively etching the photoresist film using the silicon oxide film as a mask to form the photoresist pattern.

2. A method in accordance with claim 1, wherein the step of exposing the silicon monomer is performed by exposing the silicon monomer layer to light or an electron beam.

3. The method in accordance with claim 2, wherein the step of exposing the silicon monomer is performed by exposing the silicon monomer layer to deep ultraviolet, electron beam or x-ray radiation.

4. A method in accordance with claim 1, wherein the polymerization of the silicon monomer layer is triggered by a proton which is generated by a photo acid generator contained in the photoresist film upon exposure of the silicon monomer layer.

5. A method for forming a photoresist pattern, comprising the steps of:

coating a chemically enhanced photoresist film on a lower layer;

forming a layer on the chemically enhanced photoresist film, said layer consisting essentially of silicon monomer;

exposing the silicon monomer layer and chemically enhanced photoresist film through a mask to light or an electron beam, to selectively polymerize the silicon monomer layer and form polymerized regions containing silicon;

removing the unexposed, unpolymerized regions of the silicon monomer layer by development;

subjecting the remaining polymerized regions to an oxygen plasma development process to form a silicon oxide film on the polymerized regions through reaction of oxygen with the silicon contained in the polymerized regions; and selectively etching the photoresist film using the silicon oxide film as a mask to form the photoresist pattern.

6. The method of claim 5, wherein the step of exposing the silicon monomer and chemically enhanced photoresist film is performed by exposing the silicon monomer layer to ultraviolet, electron beam or x-ray radiation.

7. The method of claim 6, wherein said silicon monomer is selected from the group consisting of $CR_2CRSi(OR)_3$ and $R_2Si(OR)_2$ wherein R is alkyl or aryl.

8. The method of claim 5, wherein the polymerization of the silicon monomer layer is triggered by protons that are generated by a photo acid generator contained in the chemically enhanced photoresist film upon exposure to the light or electron beam.

9. The method of claim 8, wherein the step of exposing the silicon monomer and chemically enhanced photoresist film is performed by exposing the silicon monomer layer to ultraviolet, electron beam or x-ray radiation.

* * * * *